United States Patent [19]

Manning

[11] Patent Number: 4,900,693
[45] Date of Patent: Feb. 13, 1990

[54] PROCESS FOR MAKING POLYSILICON FIELD PLATE WITH IMPROVED SUPPRESSION OF PARASITIC TRANSISTORS

[75] Inventor: Robert W. Manning, Colorado Springs, Colo.

[73] Assignee: United Technologies, Hartford, Conn.

[21] Appl. No.: 135,809

[22] Filed: Dec. 21, 1987

[51] Int. Cl.⁴ .......................................... H01L 21/316
[52] U.S. Cl. ....................................... 437/78; 437/79; 437/53; 437/47; 437/50; 357/53
[58] Field of Search ............... 437/53, 59, 2, 4, 46, 437/66, 78, 79, 41, 38, 47, 50; 357/52, 53, 55, 23.8

[56] References Cited

U.S. PATENT DOCUMENTS

| | | | |
|---|---|---|---|
| 4,035,829 | 7/1977 | Ipri et al. | 357/49 |
| 4,251,571 | 2/1981 | Garbanno et al. | 437/53 |
| 4,270,137 | 5/1981 | Coe | 357/53 |
| 4,397,077 | 8/1983 | Derbenwick et al. | 437/53 |
| 4,414,560 | 11/1983 | Lidow | 357/53 |
| 4,554,728 | 11/1985 | Shepard | 437/78 |
| 4,561,170 | 12/1985 | Doering et al. | 437/34 |
| 4,685,196 | 8/1987 | Lee | 437/41 |
| 4,696,092 | 9/1987 | Doering et al. | 437/26 |

OTHER PUBLICATIONS

Sze, S. M., *VLSI Technology*, McGraw-Hill, 1983, pp. 140-157.
Ghandhi, S. K., VLSI Fabrication Principles, John Wiley & Sons, 1983, pp. 376-401.

*Primary Examiner*—Brian E. Hearn
*Assistant Examiner*—T. N. Quach
*Attorney, Agent, or Firm*—Eric W. Petraske

[57] ABSTRACT

A method of forming silicon integrated circuits offers radiation resistance together with a high degree of planarity, including a thin field oxide together with a set of conductive plates over the field region combine to suppress the formation of parasitic transistors. In one embodiment, a silicon substrate is etched to form trenches and is then covered with a thin barrier layer, (410) of high quality thermal oxide. A polysilicon layer (423) is next conformally deposited and planarized until the barrier layer (410) is exposed, followed by an oxidation step for isolation or gate oxide formation.

3 Claims, 8 Drawing Sheets

PROCESS FOR MAKING POLYSILICON FIELD PLATE WITH IMPROVED SUPPRESSION OF PARASITIC TRANSISTORS

TECHNICAL FIELD

The field of the invention is that of silicon integrated circuit processing, in particular radiation hardened integrated circuits.

BACKGROUND ART

In the prior art, field regions between transistors are conventionally covered by a thick layer of oxide (silicon dioxide) grown by a wet process. It is known to use a field implant in areas between transistors in the MOS or CMOS processes. One of the functions of the field implant is the suppression of parasitic conduction channels that may be formed between adjacent active areas. Another function is the suppression of parasitic transistors that may be formed from a parasitic channel that is exposed to an electric field from a conductor, or over which some charge has been accumulated in a portion of the polysilicon or oxide above the parasitic channel region.

DISCLOSURE OF THE INVENTION

The invention relates to a silicon process for producing integrated circuits with improved radiation hardening that suppresses parasitic transistors by placing a "pseudo-gate" over a thin, high-quality oxide in field regions between adjacent active areas and biasing the pseudo-gate to suppress the formation of parasitic transistors.

A feature of the invention is that the field oxide is a thin layer similar to a gate oxide, instead of being a thick layer.

Another feature of the invention is the elimination of a field implant.

Other features and advantages will be apparent from the specification and claims and from the accompanying drawings which illustrate an embodiment of the invention.

BRIEF DESCRIPTION OF DRAWINGS

FIGS. 4 through 8 illustrate an alternative embodiment of the invention.

BEST MODE OF CARRYING OUT THE INVENTION

Figure 1:
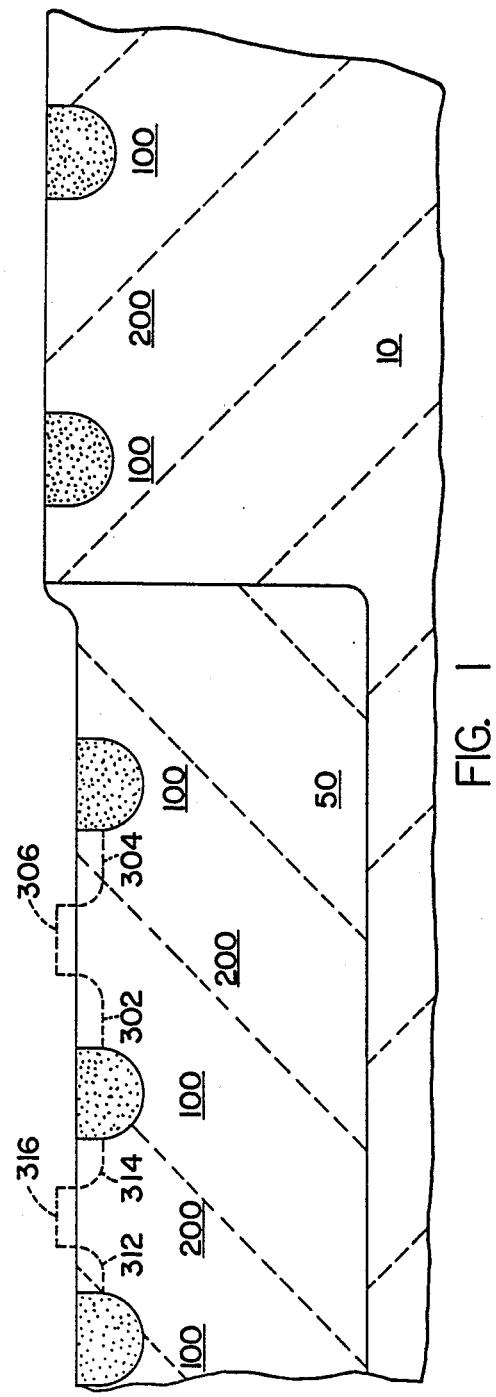
FIGS. 1 through 4 illustrate a first embodiment of the invention.

Referring now to FIG. 1, there is shown in cross-section a portion of a silicon integrated circuit. Area 10 is the substrate (or an epitaxial layer grown above a substrate in the conventional manner) in which the circuit components are to be formed. In this illustration it is N-doped. Area 50 is a P-well that is P-doped to provide the complementary N-channel transistors. Areas 100 represent an optional step in the process in which areas that will be the field region in the final circuit are doped with a channel topping implant. The field implant will have an effect on the threshold for parasitic transistors. In P-well 50, the doping agent is boron. In the N-doped substrate, the doping agent is phosphorous or arsenic. The field implant process is described more fully below with respect to an alternative embodiment of the invention.

Between the field areas there are other areas denoted by numerals 200 which are future active areas in which transistors or other circuit components such as diodes or capacitors will be formed. Two such transistors are illustrated, having sources 302 and 312 respectively, drains 304 and 314 respectively, and polysilicon gate electrodes 306 and 316 respectively.

The problem addressed by the invention is that of a parasitic transistor which can be formed, for example, between drain 314 and source 302 of adjacent transistors if there is a sufficiently high potential above region 100 to form a conducting channel through region 100. If there is some stray charge trapped above region 100, which may occur as a result of ionizing radiation passing through the chip, the charge may also turn on a parasitic transistor.

According to the invention, the combination of a conductive plate, maintained at an appropriate bias potential, above a thin, high quality oxide (meaning the same type as a gate oxide), serves to suppress the formation of parasitic transistors, in particular to make the circuit more resistant to the formation of parasitic transistors as a result of exposure to ionizing radiation. It is interesting that the structure used here to inhibit transistor formation involves the use of what is effectively a gate oxide normally used to make transistors. In P-wells, the N-channel parasitic transistor threshold decreases as the level of radiation exposure increases, so the conductive plate will be maintained at a low or negative potential in order to increase the radiation resistance. The converse is true for N-wells.

The preparation of the substrate and the wells up to the step illustrated in FIG. 1 is known to those skilled in the art, and may be performed by a number of conventional methods. Well 50 is created by a LOCOS process in this embodiment of the invention.

Figure 2:
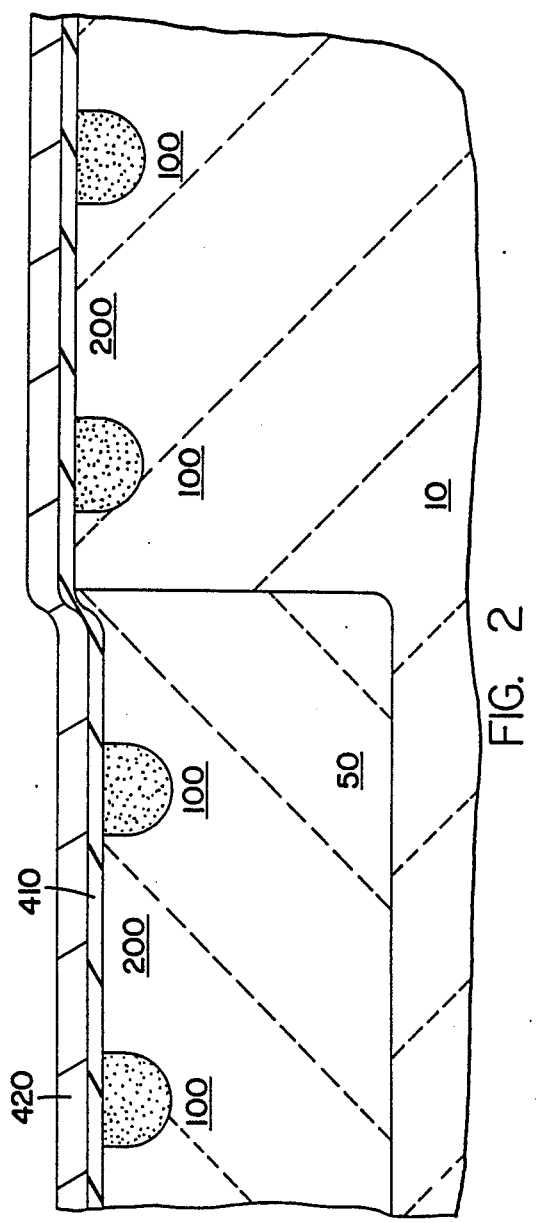

As a first step in the invention, a thin layer of high quality oxide, denoted by the numeral 410 in FIG. 2, is grown on the substrate, preferably by a dry process. The thickness of this oxide may be between 10 and 100 nm, with a value of 50 nm preferred. Next, a thin layer of polysilicon 420 is deposited above oxide layer 410. Layer 420 may be between 50 and 200 nm with 150 nm preferred. This polysilicon is doped as heavily as possible, illustratively with phosphorous. The doping concentration and the doping process are conventional.

Next, the active regions 200 are defined with a photo resist and layers 420 and 410 above the active regions are removed. Preferably, the removal step for layer 420 uses an isotropic etch, so that the width of the remaining portion of layer 420 is less than that of layer 410. The reason for this is that in subsequent steps of growing oxide the width of layer 420 will be increased. If it is first reduced in width, then the final edge will not have an overhang (or reentrant angle).

Figure 3:
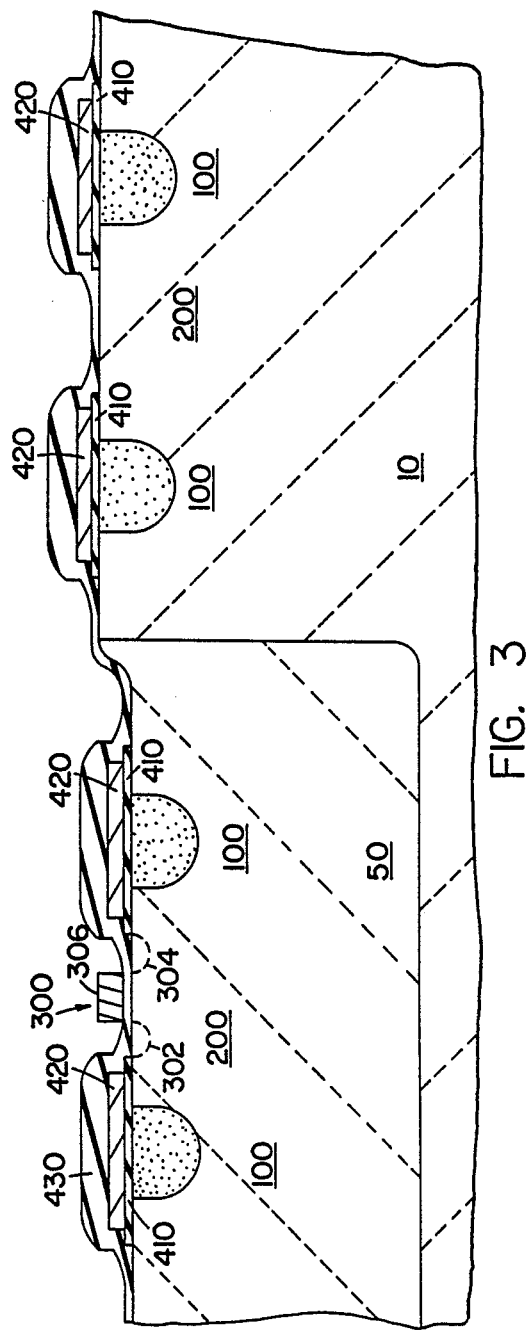

Referring now to FIG. 3, there is shown a cross section of the same area in which a layer 430 of oxide has been grown over the active region. Differential oxide growth will produce a thicker portion of layer 430 above polysilicon plate 420 than above the single-crystal active area. It may be desirable to grow a sacrificial oxide, preferably in a dry process, before the growth of oxide 430 to provide sufficient oxide thickness above plate 420 to provide sufficient isolation from conductors passing above it so that the underlying substrate region is isolated from the imposition of the electrical fields coupled through plate 420. This layer 430 will also be the gate oxide for the transistors that will be placed in the active region, so that it also must be of conventional gate oxide quality. The structure of the layers above the field region 100 is: a layer of high quality (gate-type) oxide grown on the substrate by a dry process, a thin layer of doped polycrystalline silicon, and then another layer of grown gate oxide that has been grown into the polycrystalline layer.

Transistor 300 is shown, for example, having a gate 306 over a thin portion of oxide 430 having the correct conventional gate oxide thickness of 100 nm or so, and source 302 and drain 304 formed in area 200 by a conventional transistor formation process. The area of active region 200 has been implanted with a threshold implant to produce the desired transistor threshold, as is conventional in the art.

After the formation of the gate oxide, the remainder of the circuit is formed according to conventional techniques. Those skilled in the art will readily appreciate that this technique may be applied to NMOS, PMOS, CMOS and various combinations of substrate and well doping (single tub or twin tub), as well as to the use of different doping materials.

Figure 4:
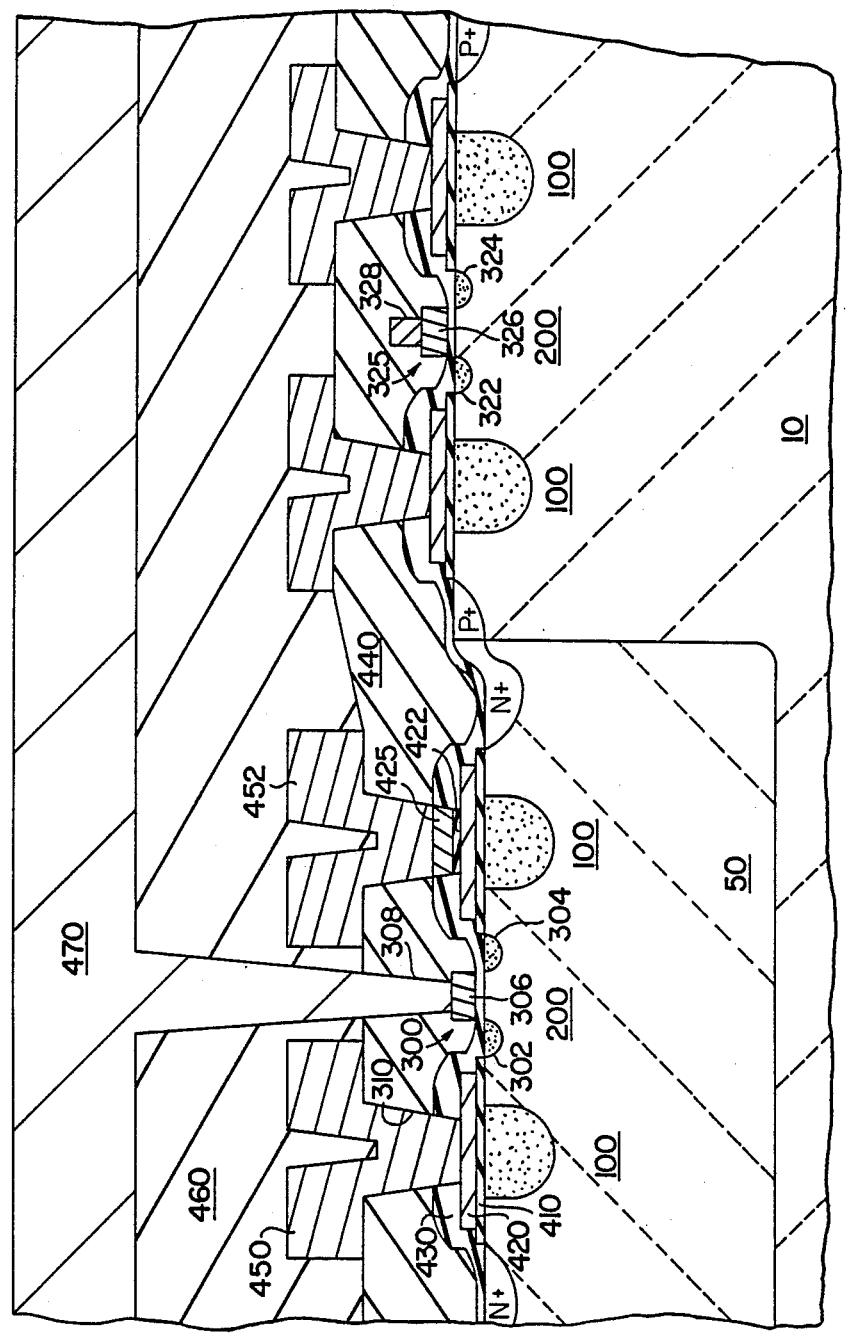

In the subsequent steps, apertures are opened to plates 420, as shown in FIG. 4, and these plates are connected through a metal or polysilicon interconnection layer to a voltage source of predetermined value in order to produce the desired bias on plates 420. In the figure, a layer 440 of oxide has been deposited above insulating layer 430 for insulation and aperture 310 has been opened to permit contact with metal layer 450. For purposes of insulation, a second layer of oxide 460 has been deposited above metal 450 and a second layer of metal 470 is above oxide 460, extending down through aperture 308 to make contact with gate 306.

On the right of the diagram, a corresponding transistor 325 has gate 326 making contact with polysilicon conductor 328, which extends perpendicular to the plane of the paper. Conductor 328 is part of a poly layer that will also extend over the field regions, resting on layer 430. Those skilled in the art will have no difficulty in constructing alternative embodiments of the invention in which different materials on different levels of the circuit are used to form the various connections.

In P-well 50, the transistors will be N-channel and therefore the threshold of the transistors will decrease as the amount of radiation exposure increases. The plates 420 in the P-well 50 area should therefore be connected to a low voltage value. Ground may be used if there are only two voltages available. Alternatively, a charge pump or a separate voltage pin on the chip may be used to connect plates 420 to a source of negative voltage. For purposes of this application, the term "potential source terminal" will be used to refer to connection to the "rails", or to the lines connecting to the power supply and also to connection to an on-chip charge pump or other source.

The field areas in the n-doped epitaxial layer will have p-channel transistors whose threshold increases as a function of radiation exposure and the plates 420 in that region will be connected to a source of relatively positive voltage.

An advantageous feature of the invention is that the combination of plate 420, oxide 410, and the underlying substrate region 100 forms a capacitor. This capacitive layer may be patterned and cut to size to form capacitors of the correct value and used in the circuit. In addition, a second oxide layer 422 followed by a second polysilicon layer 425 or metal layer 425 may be used to form a second capacitor with 420 as the bottom plate. This capacitor may also be used as a circuit element.

Figure 5:
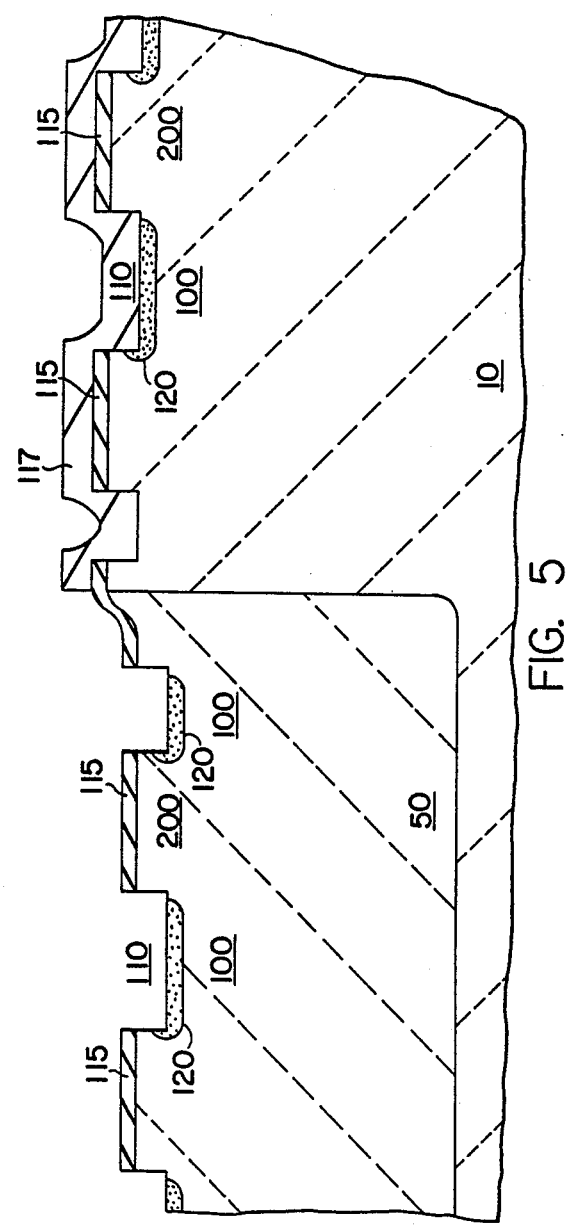

Referring now to FIG. 5, there is shown an alternative embodiment of the invention which produces an even greater degree of planarity than the first embodiment. In this embodiment, similar features of the invention receive the same or similar numbers to the first embodiment.

A substrate 10 with p-well 50 and field regions 100 and active regions 200 is prepared as before. The field regions 100 are patterned with a photoresist 115 and then a trench in the range of 200 to 700 nm, preferably 400 nm, is etched into the silicon. These trenches are denoted by the numerals 110. An optional phosphorous field implant may be implanted across the wafer, with photoresist 115 still in place, to form the counterparts to areas 100 in the previous embodiment. This implant is intended to control the parasitic transistor threshold in the field regions of the n-doped layer on the right of the figure. P-well 50 may be blocked off if that is desired. The dose required for setting the n-well threshold in region 10 is smaller than that for the p-well threshold in region 50, so that the presence of this unwanted doping implant in p-well 50 may simply be tolerated.

Next, a second layer of resist 117 is placed above layer 115 and is patterned with the p-well mask. An optional boron field implant, heavy enough to compensate for the previous phosphorous, is performed in the p-well field regions that are left open by mask 117. These two implants are those that would be used to form regions 100 in the previous embodiment.

Figure 6:
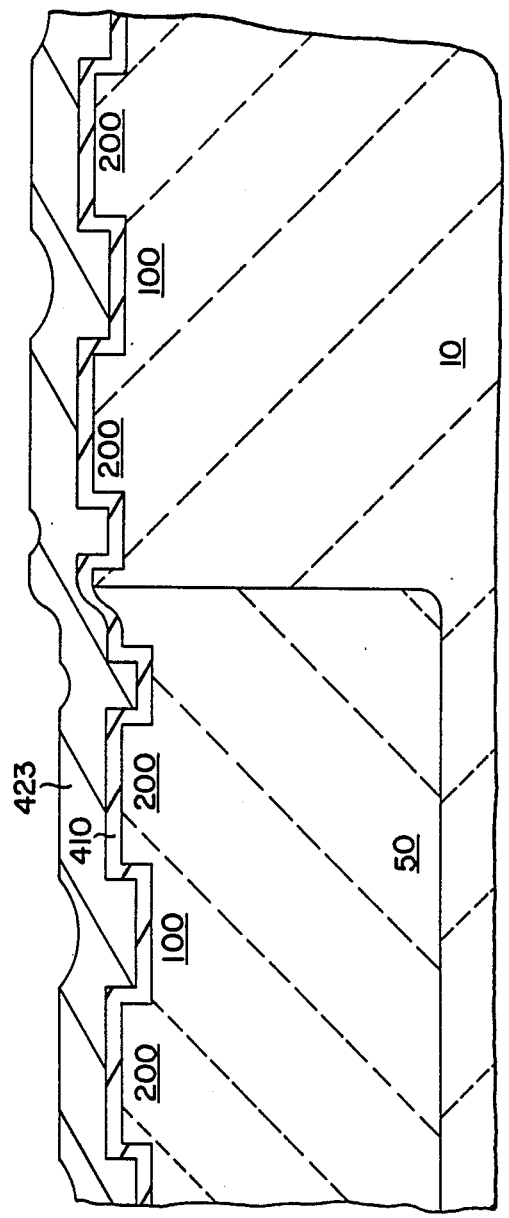

The resistive layers 115 and 117 are stripped off and a high quality oxide 410 is grown over the entire wafer, as shown in FIG. 6, penetrating into trenches 110 and covering the sides. This layer 410 is the same as that in the previous embodiment, with the same option of a sacrificial oxide step.

Figure 7:
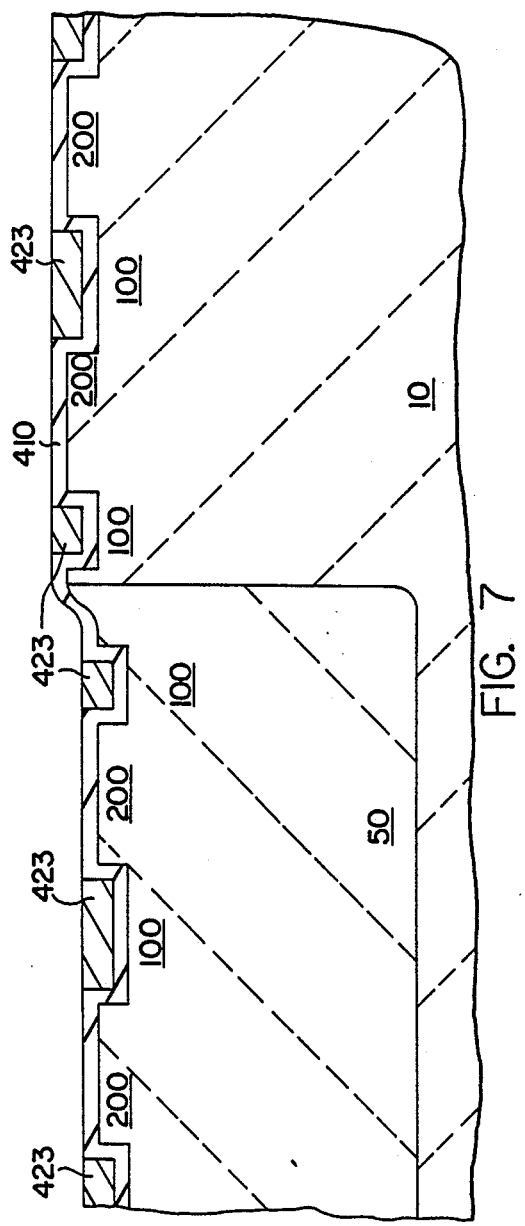

Next, a layer 423 of polysilicon is also deposited over the wafer. As shown in FIG. 6, this layer of polysilicon is relatively thick compared to that of the previous embodiment, in the range of 1 to 1.5 microns. Preferably the polysilicon 423 is deposited thickly enough so that there is essentially no difference in depth over the active regions and field regions. A blanket etch of polysilicon 423 is preformed. The etchant, which may be any of a number of conventional ones that do not attack oxide, is chosen so that the etching process will stop when it reaches oxide layer 410. The result of this step is shown in FIG. 7, in which there is a very flat surface layer having the same height as layer 410 and consisting of oxide layer 410 above the active region and a polysilicon plate 423 above the future field region and embedded in oxide.

An alternative embodiment for this step is to spin on a photo resist and use an etch which attacks the resist at about the same rate as it does the polysilicon. This etchant also must not attack oxide 410. With this alternative, oxide layer 410 may be less thick, since the resist will fill in the depressions above trenches 110 to make a planar starting surface.

Figure 8:
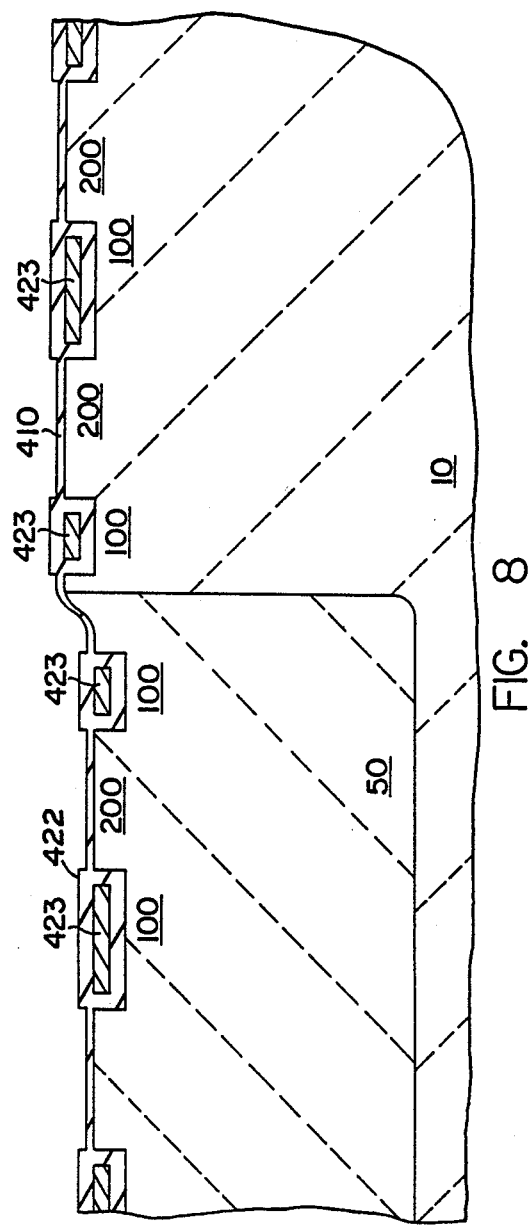

Next, as shown in FIG. 8, the layer of oxide 410 above the active region is increased and a new layer of oxide 432 above plates 423 in the future field region is grown, preferably by a dry oxidation technique. As in the previous embodiment, sacrificial oxidation may be required to make the layer of oxide 432 thick enough to provide isolation from conductors that may pass over the region.

The transistors, diodes and other circuit elements are then formed by conventional processes, as in the previous embodiment.

The advantage of this alternative process is that the use of the trench results in plates 423 that are buried below the surface of the wafer and therefore the surface is more planar than in the previous embodiment.

A further advantage is that the vertical displacement of the implanted region in the second embodiment also helps to reduce any unwanted effect on the transistors from the field implant.

Once the circuit is completed, the field plates 420 and 423 in both embodiments can be tied to any convenient voltage value. One choice is one of the rail voltages (i.e. p-well plate tied to ground and n-well plate tied to VDD, normally 5 volts). If the circuit is analog, the plates could be tied to the analog voltage while the remainder of the CMOS circuitry is tied to 5 volts and ground. This additional voltage offers a further degree of flexibility to the circuit designer.

As a further alternative, a separate power pin could be added to the circuit to supply power to the field plates. This would permit the application of a negative voltage or a voltage greater than 5 volts. An on-chip generated voltage could also be used for plates 420 and 423, with the known engineering trade-off of the use of chip area and the limitations of current supply.

Those skilled in the art will readily be able to devise further embodiments of the invention, which is not meant to be limited to the embodiments disclosed herein.

I claim:

1. A method of forming an integrated circuit comprising the steps of:
    preparing a silicon substrate region doped a predetermined manner and containing future active areas and future field areas;
    etching said substrate to form trenches of a predetermined depth in said future field areas;
    growing a thin barrier layer of high quality oxide on said substrate above said future active and field areas;
    forming a plate layer of high conductivity polysilicon above said thin layer of oxide to form a conductive polysilicon plate extending downwardly below the surface of said substrate and insulated from said substrate in said future field areas by said thin layer of oxide and having a substantially planar top surface;
    etching said plate layer until said barrier layer lying above said future active areas is exposed, whereby the top surface of said barrier layer and said plate layer are substantially planar and said conductive plate is buried below said top surface;
    growing a gate oxide layer above said active areas;
    forming FETs in selected locations in said active areas;
    connecting said polysilicon plate to a potential source terminal having a predetermined magnitude and polarity such that said polysilicon plate can apply a predetermined electric field to said substrate to suppress the formation of parasitic transistors in said future field areas; and
    connecting said FETS to form an integrated circuit.

2. A method according to claim 1, in which said step of forming said plate layer comprises depositing a layer of doped polysilicon having a predetermined thickness such that the surface of said deposited layer is planar within a predetermined limit.

3. A method according to claim 1, in which said step of forming said plate layer comprises depositing a layer of doped polysilicon having substantial depressions above said trench areas and filling said depressions with a predetermined filler material.

* * * * *